United States Patent
Yabe et al.

(10) Patent No.: US 10,910,044 B2
(45) Date of Patent: Feb. 2, 2021

(54) STATE CODING FOR FRACTIONAL BITS-PER-CELL MEMORY

(71) Applicant: SanDisk Technologies LLC, Addison, TX (US)

(72) Inventors: Hiroki Yabe, Yokohama (JP); Masahiro Kano, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/146,135

(22) Filed: Sep. 28, 2018

(65) Prior Publication Data
US 2020/0105340 A1    Apr. 2, 2020

(51) Int. Cl.
G11C 11/34    (2006.01)
G11C 11/56    (2006.01)
G06F 11/10    (2006.01)

(52) U.S. Cl.
CPC ...... G11C 11/5628 (2013.01); G06F 11/1072 (2013.01); G11C 11/5642 (2013.01); G11C 2211/5641 (2013.01); G11C 2211/5648 (2013.01)

(58) Field of Classification Search
CPC ............ G11C 11/5628; G11C 11/5642; G11C 2211/5648; G11C 2211/5641; G06F 11/1072
USPC .................................................... 365/185.03
See application file for complete search history.

(56) References Cited

U.S. PATENT DOCUMENTS

| | | | |
|---|---|---|---|
| 6,469,931 B1 | 10/2002 | Ban | |
| 6,847,550 B2 | 1/2005 | Park | |
| 7,388,781 B2 | 6/2008 | Litsyn | |
| 7,643,342 B2 | 1/2010 | Litsyn | |
| 7,990,766 B2 | 8/2011 | Litsyn | |
| 8,085,590 B2 | 12/2011 | Litsyn | |
| 8,804,423 B2 | 8/2014 | Litsyn | |
| 8,848,442 B2 | 9/2014 | Sharon | |
| 9,070,450 B2 | 6/2015 | Antome | |
| 9,229,848 B2 | 1/2016 | Parthasarathy | |
| 9,502,120 B2 | 11/2016 | Kasorla | |
| 2009/0109747 A1* | 4/2009 | Radke ............. | G11C 11/5621 365/185.03 |
| 2014/0281842 A1 | 9/2014 | Wood | |
| 2014/0347924 A1 | 11/2014 | Kasorla | |
| 2015/0058702 A1 | 2/2015 | Ramamoorthy | |

(Continued)

FOREIGN PATENT DOCUMENTS

WO    2007102141 A1    9/2007

OTHER PUBLICATIONS

Wenzhe Zhao, On the Case of Using Aggregated Page Programming for Future MLC NAND Flash Memory, Aug. 12, 2014 (Year: 2014).*

(Continued)

*Primary Examiner* — Tha-O H Bui
(74) *Attorney, Agent, or Firm* — Vierra Magen Marcus LLP

(57) ABSTRACT

An apparatus includes a pair of memory cells configured to represent data using joint data states where one of the joint data states comprises an error-prone joint data state. The apparatus further includes an encoder configured to convert user data into joint data states according to a dual-cell gray-code encoding scheme in which the error-prone joint data state does not encode user data.

20 Claims, 7 Drawing Sheets

(56) References Cited

U.S. PATENT DOCUMENTS

2016/0104527 A1* 4/2016 Parthasarathy ........... G06F 3/06 714/722

OTHER PUBLICATIONS

Minghai Qin, "Fractional Bits-per-cell for NAND Flash with Low Read Latency," Publication, GLOBECOM 2017-2017 IEEE Global Communications Conference, published on or before Dec. 8, 2017; Western Digital Research, San Jose, California, USA (shown in attachment 1).

C.E.Shannon, "A Mathematical Theory of Communication," Journal, The Bell Systems Technical Journal vol. 27, pp. 379-423, 623-656, published in 1948 (shown in attachment 2).

Thomas M. Cover and Joy A.Thomas, "Elements of Information Theory," Book, Published by Wiley-Interscience, New York, in 1991 (shown in attachment 3).

Robert G. Gallager, "Information Theory and Reliable Communication," Book, Published by John Wiley and Sons, New York, NY, in 1968 (shown in attachment 4).

Shu Lin and Daniel J. Costello Jr., "Error Control Coding: Fundamentals and Applications," Book, Published by Prentice Hall, Englewood Cliffs, NJ, in 1983 (shown in attachment 5).

Udo Wachsmann, Robert F.H. Fischer, and Johannes B.Huber, "Multilevel Codes: Theoretical Concepts and Practical Design Rules," Journal, IEEE Transaction on Information Theory, vol. 45, No. 5, pp. 1361-1391, published in Jul. 1999 (shown in attachment 6).

Giuseppe Caire, Giorgio Taricco and Ezio Biglieri, "Bit-Interleaved Coded Modulation," Journal, IEEE Transactions on Information Theory, vol. 44, No. 3, pp. 927-946, published in May 1998 (shown in attachment 7).

Judea Pearl "Probabilistic Reasoning in Intelligent Systems," Book, Published by Morgan Kaufman Publishers, San Mateo, CA, in 1988 (shown in attachment 8).

Yaniv Nana, Eran Sharon and Simon Litsyn, "Improved Decoding of LDPC Coded Modulations," Journal, IEEE Transactions on Information Theory, vol. 10, No. 5, pp. 375-377, published in May 2006 (shown in attachment 9).

Wenzhe Zhao, Guiqiang Dong, Hui Han, Nanning Zheng and Tong Zhang, "On the Case of Using Aggregated Page Programming for Future MLC NAND Flash Memory," Journal; Circuits, Systems, and Signal Processing vol. 34 iss. 2, Published Aug. 12, 2014 (shown in attachment 10).

* cited by examiner

FIG. 3

|   | 0 | 1 | 2 | 3 | 4 | 5 |
|---|---|---|---|---|---|---|
| 0 | 11111 | 10111 | 10110 | 10010 | 10011 | ■ |
| 1 | 11011 | ■ | 10100 | 10000 | 10001 | 10101 |
| 2 | 11010 | 11110 | 11100 | 11000 | 11001 | 11101 |
| 3 | 01010 | 01110 | 01100 | 01000 | 01001 | 01101 |
| 4 | 01011 | ■ | 00100 | 00000 | 00001 | 00101 |
| 5 | 01111 | 00111 | 00110 | 00010 | 00011 | ■ |

Rows 310 (horizontal), Columns 320 (vertical), 300

FIG. 4

| | 0 | 1 | 2 | 3 | 4 | 5 | 6 | 7 | 8 | 9 | 10 | 11 |
|---|---|---|---|---|---|---|---|---|---|---|---|---|
| 0 | 1111111 | 1111110 | 1101110 | 1101111 | 1101011 | 1101010 | 0101010 | 0101011 | 0101111 | 0101110 | 0111110 | 0111111 |
| 1 | 1111101 | 1111100 | 1101100 | 1101101 | 1101001 | 1101000 | 0101000 | 0101001 | 0101101 | 0101100 | 0111100 | 0111101 |
| 2 | 1011101 | 1011100 | ■ | ■ | 1111001 | 1111000 | 0111000 | 0111001 | ■ | ■ | 0011100 | 0011101 |
| 3 | 1011111 | 1011110 | ■ | ■ | 1111011 | 1111010 | 0111010 | 0111011 | ■ | ■ | 0011110 | 0011111 |
| 4 | 1011011 | 1011010 | 1010010 | 1010011 | 1110011 | 1110010 | 0110010 | 0110011 | 0010011 | 0010010 | 0011010 | 0011011 |
| 5 | 1011001 | 1011000 | 1010000 | 1010001 | 1110001 | 1110000 | 0110000 | 0110001 | 0010001 | 0010000 | 0011000 | 0011001 |
| 6 | 1001001 | 1001000 | 1000000 | 1000001 | 1100001 | 1100000 | 0100000 | 0100001 | 0000001 | 0000000 | 0001000 | 0001001 |
| 7 | 1001011 | 1001010 | 1000010 | 1000011 | 1100011 | 1100010 | 0100010 | 0100011 | 0000011 | 0000010 | 0001010 | 0001011 |
| 8 | 1001111 | 1001110 | 1000110 | 1000111 | 1100111 | 1100110 | 0100110 | 0100111 | 0000111 | 0000110 | 0001110 | 0001111 |
| 9 | 1001101 | 1001100 | 1000100 | 1000101 | 1100101 | 1100100 | 0100100 | 0100101 | 0000101 | 0000100 | 0001100 | 0001101 |
| 10 | ■ | ■ | 1010100 | 1010101 | 1110101 | 1110100 | 0110100 | 0110101 | 0010101 | 0010100 | ■ | ■ |
| 11 | ■ | ■ | 1010110 | 1010111 | 1110111 | 1110110 | 0110110 | 0110111 | 0010111 | 0010110 | ■ | ■ |

Rows 410

Columns 420

400

| | 0 | 1 | 2 | 3 | 4 | 5 | 6 | 7 | 8 | 9 | 10 | 11 |
|---|---|---|---|---|---|---|---|---|---|---|---|---|
| 0 | ■ | 1110011 | 1110010 | 1110110 | 1110111 | 1111111 | 1111111 | 1110111 | 1010110 | 1010010 | 1010011 | ■ |
| 1 | 1110101 | 1110001 | 1110000 | 1110100 | ■ | 1111011 | 1011011 | ■ | 1010100 | 1010000 | 1010001 | 1010101 |
| 2 | 1111101 | 1111001 | 1111000 | 1111100 | 1111110 | 1111111 | 1011111 | 1011110 | 1011100 | 1011000 | 1011001 | 1011101 |
| 3 | 1101101 | 1101001 | 1101000 | 1101100 | 1101110 | 1101111 | 1001111 | 1001110 | 1001100 | 1001000 | 1001001 | 1001101 |
| 4 | 1100101 | 1100001 | 1100000 | 1100100 | ■ | 1101011 | 1001011 | ■ | 1000100 | 1000000 | 1000001 | 1000101 |
| 5 | ■ | 1100011 | 1100010 | 1100110 | 1100111 | 1101111 | 1001111 | 1000111 | 1000110 | 1000010 | 1000011 | ■ |
| 6 | ■ | 0100011 | 0100010 | 0100110 | 0100111 | 0101111 | 0001111 | 0000111 | 0000110 | 0000010 | 0000011 | ■ |
| 7 | 0100101 | 0100001 | 0100000 | 0100100 | ■ | 0101011 | 0001011 | ■ | 0000100 | 0000000 | 0000001 | 0000101 |
| 8 | 0101101 | 0101001 | 0101000 | 0101100 | 0101110 | 0101010 | 0001010 | 0001110 | 0001100 | 0001000 | 0001001 | 0001101 |
| 9 | 0111101 | 0111001 | 0111000 | 0111100 | 0111110 | 0111010 | 0011010 | 0011110 | 0011100 | 0011000 | 0011001 | 0011101 |
| 10 | 0110101 | 0110001 | 0110000 | 0110100 | ■ | 0111011 | 0011011 | ■ | 0010100 | 0010000 | 0010001 | 0010101 |
| 11 | ■ | 0110011 | 0110010 | 0110110 | 0110111 | 0111111 | 0011111 | 0010111 | 0010110 | 0010010 | 0010011 | ■ |

Rows 510 / Columns 520 / 500

FIG. 5

STATE CODING FOR FRACTIONAL BITS-PER-CELL MEMORY

FIELD OF THE DISCLOSURE

This disclosure is generally related to data storage devices and more particularly to state coding techniques for fractional bits-per-cell memory.

BACKGROUND

Non-volatile data storage devices, such as flash solid state memory devices or removable storage cards, have allowed for increased portability of data and software applications. Memory devices can enhance data storage density by storing multiple bits in each memory cell. For example, flash memory devices may provide increased storage density by storing 2 bits-per-cell, 3 bits-per-cell, 4 bits-per-cell, or more.

However, increasing the number of bits that can be stored in a memory cell often increases a bit error rate (BER) for data stored in the memory device. This occurs because the number of data states (or levels) within the memory cell must also increase to represent the extra bits, making it more difficult to distinguish the various data states of a memory cell.

Accordingly, improved fractional bits-per-cell storage techniques are desirable.

BRIEF DESCRIPTION OF THE DRAWINGS

FIG. 3 illustrates an example joint data state map according to an embodiment of the present disclosure;

FIG. 4 illustrates another example joint data state map according to an embodiment of the present disclosure;

FIG. 5 illustrates yet another example joint data state map according to an embodiment of the present disclosure;

DETAILED DESCRIPTION

Figure 1:
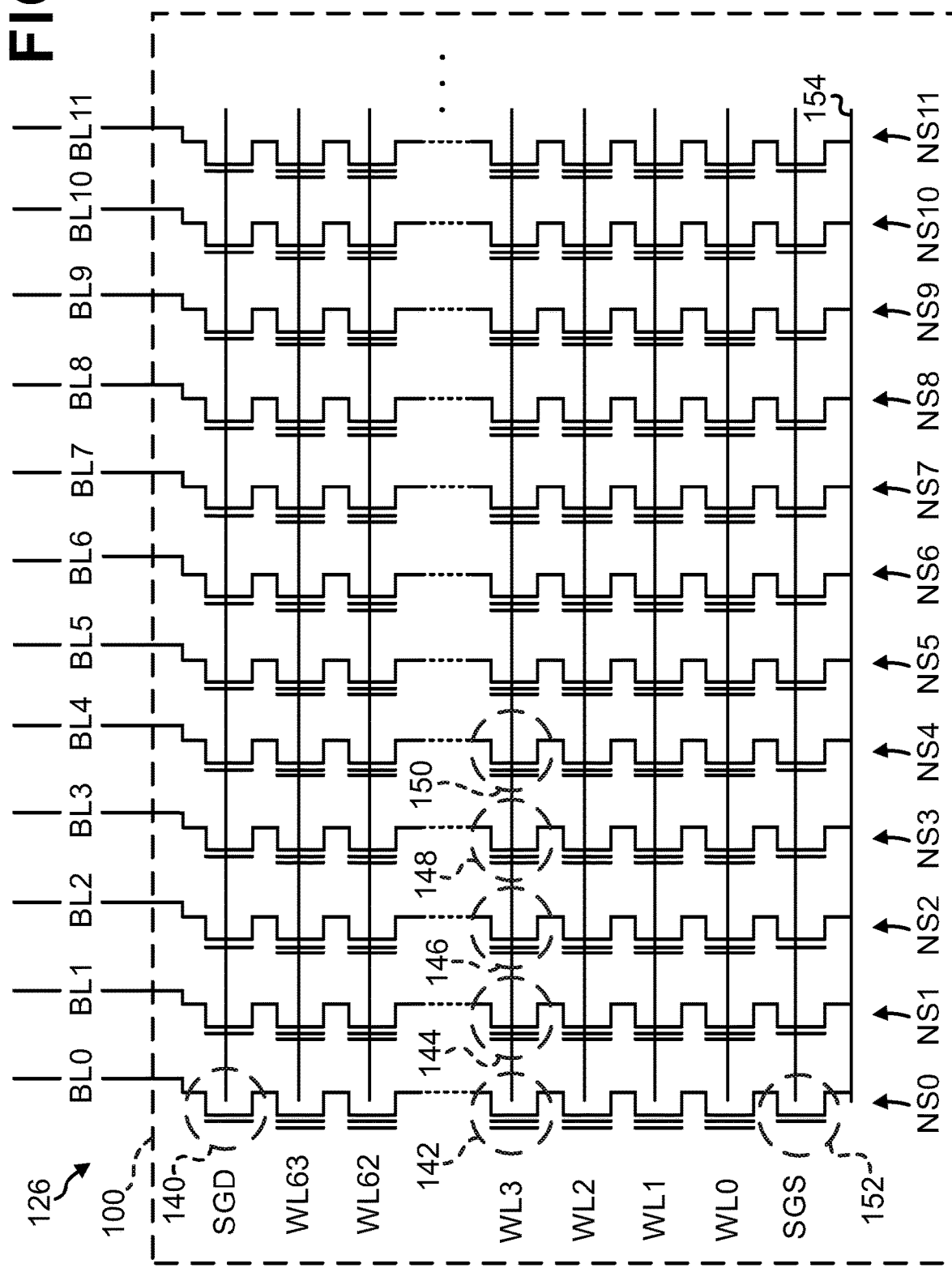
FIG. 1 depicts an embodiment of an array of memory cells including bit and word lines.

Particular examples in accordance with the disclosure are described below with reference to the drawings. It should be noted that multiple similar elements can be labeled with a number and a letter. When an element is referred to by the number without a letter, this can generally refer to any one of the illustrated elements with the number, to some of the illustrated elements with the number, to all of the illustrated elements with the number, or to another similar element. When an element is referred to without a number, this can refer to the element in general without limitation to any specific embodiment. Also, in order to avoid the undue proliferation of reference numerals and lead lines on a particular figure in which multiple instances of the same item appear, in general, only one such item will be labeled with a reference numeral and lead line. In the description, common features can be designated by common reference numbers. Similar or exemplary features can be designated with similar reference numbers.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM or PCM). Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple-level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines.

A "sub-block" of memory is a subset of a block of memory. For instance, a sub-block is a subset of memory cells corresponding to a subset of the word lines of a block of memory. In an embodiment, a sub-block includes 50 word lines in a block of memory, where the block of memory includes more than 50 word lines. A sub-block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 150 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a non-volatile manner. In an embodiment, triple layer dielectric formed of silicon oxide, silicon nitride, and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
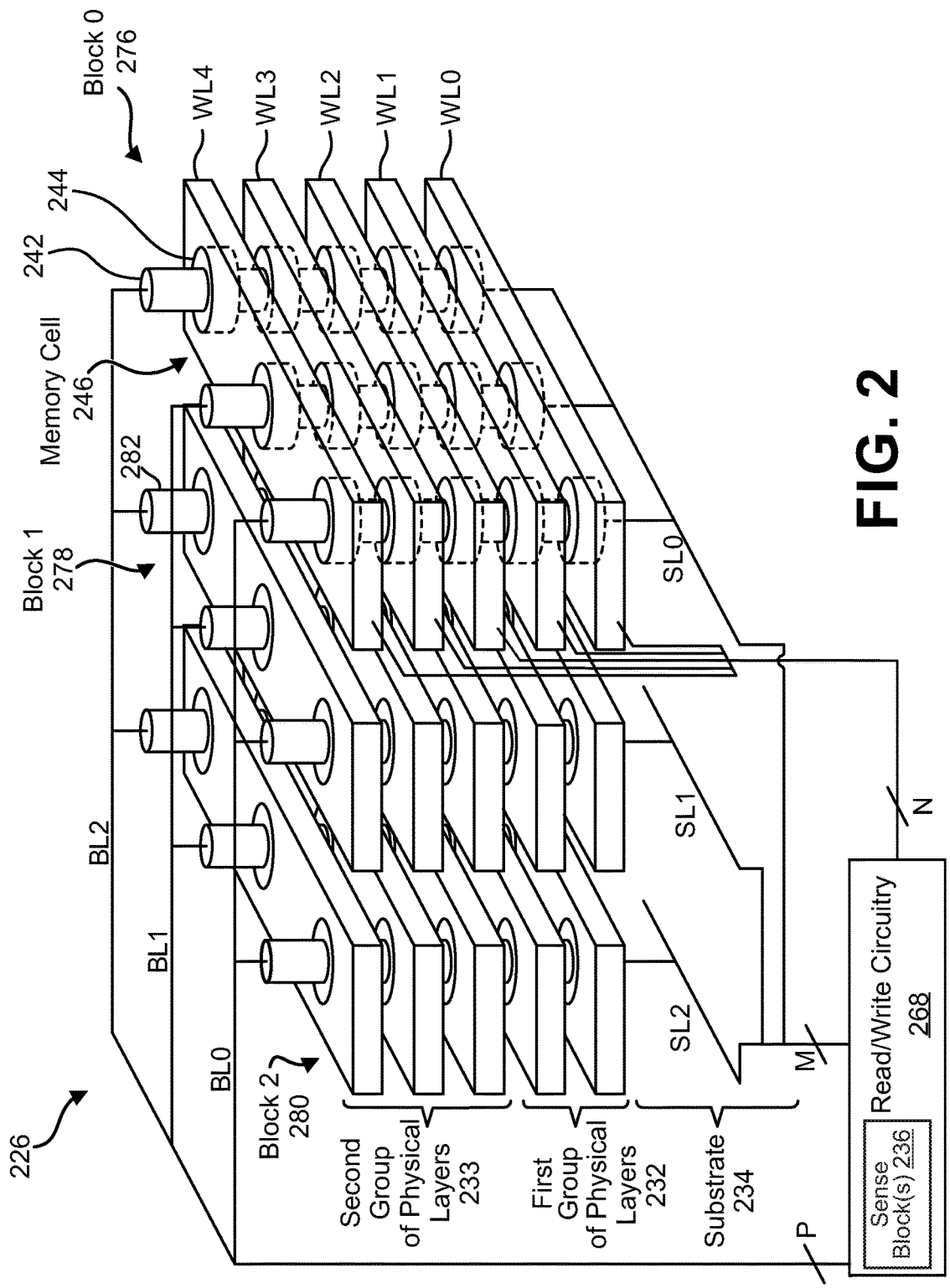
FIG. 2 is a diagram illustrating an embodiment of a 3D memory in a NAND configuration.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense block(s) 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4).

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

FIG. 3 illustrates one example of a joint data state map 300 according to an embodiment of the present disclosure. The joint data state map 300 shown in FIG. 3 is based on a pair of memory cells (not shown) that are each programmed to store one of six different data states within each memory cell. As illustrated in FIG. 3, each of the rows 310 represent a different data state for a first memory cell, while each of the columns 320 represent a different data state for a second memory cell. A "data state" within each cell comprises a particular electrical characteristic for that cell, the cell is configured to have two or more electrical characteristics such that at least one data binary value can be represented in the memory cell. In one embodiment, the memory cell is a charge trap or floating gate transistor and the electrical characteristic is a range of threshold voltage levels for the cell. In such an embodiment, a memory cell may store a charge which impacts the threshold voltage level for the cell. A threshold voltage level within a certain range may represent a particular data state for the memory cell. A controller sensing, or reading, the memory cell applies different voltage levels to a control gate for the memory cell to determine which threshold voltage level activates memory cell and corresponds to a particular data state. Likewise, in another embodiment, the electrical characteristic comprises an electrical resistance level and different resistance levels for a cell may be represent different data states.

A "joint data state" refers to a state identified by a combination of the data states stored in each of a pair of memory cells. Each joint data state (shown as an entry in the joint data state map 300) is associated with one of the six rows 310 (labeled as rows 0-5) and one of the six columns 320 (labeled as columns 0-5) in the joint data state map 300. For example, the joint data state at row zero and column zero (which can also be written in coordinate form as (0, 0) with the first number indicating the row and the second number indicating the column) is associated with the binary number 11111. Likewise, the joint data state at (4, 5) is associated with the binary number 00011, and so forth.

Thus, a "joint data state map" refers to a two-dimensional graphical representation of all possible joint data states for a pair of memory cells that are each configured to be programmed to one of multiple different data states.

In one embodiment, both memory cells of the pair of memory cells are physically coupled to a common word line, and each memory cell of the pair is coupled to a different bit line. In an alternative embodiment, each memory cell of the pair of memory cells is coupled to a common bit line, and each cell of the pair of memory cells is coupled to a different word line.

The pair of memory cells that form the basis of the joint data state map 300 shown in FIG. 3 are each configured to represent 2.5 fractional bits-per-cell with 6 data states in each memory cell and 36 total possible joint data states. As used herein, "fractional bits-per-cell" refers to a memory cell programmed to represent a non-power-of-two number of data states. For example, a memory cell programmed for 2.5 fractional bits-per-cell has 6 data states, 36 total joint data states, and a 5-bit binary number encoding associated with each joint data state. A memory cell programmed for 3.5 fractional bits-per-cell has 12 data states, 144 total joint data states, and 7-bit binary number encoding associated with each joint data state. A memory cell programmed for 4.5 fractional bits-per-cell has 24 data states, 576 total joint data states, and 9-bit binary number encoding associated with each joint data state, and so forth. Thus, in general, a pair of memory cells programmed for n·5 fractional bits-per-cell can store data with binary number encodings having (2×n·5) bits. Moreover, in various embodiments, the available number of data states for a memory cell is a non-power-of-two number and the total number of joint data states is also a non-power-of-two number. As used in this application, a non-power-of-two number is any number that is not equal to $2^n$, where n may be any positive integer not equal to a power of 2 (e.g., not equal to 2, 4, 8, 16, 32, etc.). Thus, a 2.5 bit fractional memory cell is a memory cell that has 6 possible data states for storing encoded 5-bit numbers using a pair of memory cells; a 3.5 bit fractional memory cell is a memory cell that has 12 possible data states for storing encoded 7-bit numbers using a pair of memory cells; and a 4.5 bit fractional memory cell is a memory cell that has 24 possible data states for storing encoded 9-bit numbers using a pair of memory cells.

However, may be desirable to store data utilizing a power-of-two number of "used" joint data states. This can be accomplished by choosing a subset of the total number of joint data states to be a power-of-two number of joint data states in which to represent or encode user data. As used herein, "user data" includes any data that can be represented with binary numbers including, but not limited to, data created by a specific user or set of users, system data, host data, etc. In this example, a subset of the joint data states (comprising $2^5$ or 32 out of the 36 joint data states) is selected to represent user data. This subset of joint data states can be referred to as "used joint data states." Accordingly, as used herein a "used joint data state" refers to a joint data state associated with a defined data value used to represent user data.

In this example, the remaining four joint data states (36−32=4) are not used to represent user data. This subset of joint data states can be referred to as "unused joint data states." "Error-prone joint data states" comprise joint data states in which memory cells placed in those data states are more susceptible to errors (e.g. disturb errors, charge loss errors, temperature dependent errors, etc.) than other joint data states. In the embodiment illustrated in FIG. 3, the error-prone joint data states comprise joint data states located at (0, 0), (0, 5), (5, 0) and (5, 5) (i.e., the four corners of the joint data state map 300). In alternative embodiments, the error-prone data states may be situated at other positions on a joint data state map. As illustrated in FIG. 3, error-prone joint data states may also comprise unused joint data states. In one embodiment, all error-prone joint data states are unused joint data states. An error-prone joint data state that does not encode user data is an error-prone joint data state that is also an unused joint data state (e.g., the joint data states located at (5, 0) and (5, 5) in the joint data state map 300 of FIG. 3). Accordingly, as used herein a "unused joint data state" refers to a joint data state that is associated with an undefined (or unused) data value which is not used to represent user data (e.g., not utilized to represent a binary number). As can be seen in FIG. 3, each of the four unused joint data states respectively located at (1,1), (1, 4), (5, 0), and (5, 5) within the array, with each unused joint data state shown as "blacked-out" to signify that these joint data states represent undefined (or unused) joint data states that do not represent or encode user data. In the illustrated embodiment, the number of unused joint data states is a power-of-two number (i.e., any number that is equal to $2^n$ where n a positive integer).

The other 32 used joint data states are located in the remaining positions within the joint data state map 300 and are each associated with a defined data value used to represent user data, such as a unique 5-bit binary number, as previously discussed. A 5-bit binary number can represent a total of $2^5$ (or 32) different values. Each of these different binary numbers are further arranged within the joint data state map 300 such that the binary numbers of any two used joint data states that are horizontally or vertically adjacent to each other within the joint data state map 300 differ from each other by only one bit, according to an embodiment of a dual-cell gray-code encoding scheme disclosed herein. Within a gray-code encoding scheme, adjacent data states encoded for a memory cell differ only by one bit. In contrast, a "dual-cell gray-code encoding scheme" is an ordering of multiple binary numbers such that any two successive binary numbers along both horizontal and a vertical dimension of a joint data state map 300 differ from each other by only one bit (i.e., a hamming distance of one) in a joint data state map. A dual-cell gray-code encoding scheme reduces the magnitude of errors caused by unintentional shifts of data states to adjacent data states within a memory cell by limiting the number of bits that change between adjacent data states to only one bit.

One method of reducing bit error rates caused by unintentional shifts of data states between adjacent data states within a memory cell is to select certain locations (i.e., error-prone joint data states) within a joint data state map for placement of the unused data states. For example, a memory cell that stores a highest data state may suffer from data retention issues, resulting in an unintentional downward shift of the data state, and a memory cell that stores a lowest data state may suffer from read/program disturb issues, resulting in an unintentional upward shift of the data state. A "highest data state" refers to a highest physical state of a memory cell. For example, a highest data state for a memory cell configured to store different threshold voltage levels corresponds to a highest threshold voltage level (or highest threshold voltage range) that can be stored in the memory cell. Similarly, a highest data state for a memory cell configured to store different resistance levels corresponds to a highest threshold resistance level (or highest threshold resistance range) that can be stored in the memory cell. A "lowest data state" refers to a lowest physical state of a memory cell. For example, a lowest data state for a memory cell configured to store different voltage levels corresponds to a lowest threshold voltage level (or lowest threshold voltage range) that can be stored in the memory cell. Similarly, a lowest data state for a memory cell configured to store different resistance levels corresponds to a lowest threshold resistance level (or lowest threshold resistance range) that can be stored in the memory cell.

Accordingly, it can be beneficial to place the unused data states at certain locations within a joint data state map to avoid combinations of the highest data states and/or the lowest data states for each memory cell in the pair of memory cells, while at the same time maintaining a dual-cell gray-code encoding scheme of joint data states within a given joint data state map.

In the example shown in FIG. 3, one of the unused joint data states has been placed at (5, 5) corresponding to a first memory cell (of the pair or memory cells) in a highest data state and a second memory cell (of the pair or memory cells) in a highest data state. In this manner, bit error rates due to data retention issues for both cells are minimized. Likewise, another one of the unused joint data states shown in FIG. 3 has been placed at (5, 0) corresponding to the first memory cell in a highest data state and the second memory cell in a lowest data state. In this manner, bit error rates due to data retention issues for the first memory cell are minimized, and bit error rates due to read/program disturbs for the second memory cell are also minimized. Moreover, the dual-cell gray-code encoding scheme of joint data states within the joint data state map 300 has been maintained with unused joint data states placed at (5, 5) and (5, 0).

In other embodiments of joint data state maps that utilize 2.5 fractional bits-per-cell (not shown), the additional placement of unused joint data states can also be realized at (0, 0) and/or (0, 5), while maintaining a dual-cell gray-code encoding scheme of joint data states within the joint data state map 300. For example, placement of a unused joint data state at (0, 0) would correspond to the first memory cell in a lowest data state and the second memory cell in a lowest data state. In this manner, bit error rates due to read/program disturbs for both memory cells would be minimized. Likewise, placement of a unused joint data state at (0, 5) would correspond to the first memory cell in a lowest data state and the second memory cell in a highest data state. In this manner, bit error rates due to data retention issues for the second memory cell would be minimized and bit error rates due to read/program disturbs for the first memory cell would also be minimized.

In summary, embodiments of different joint data state map implementations utilizing 2.5 fractional bits-per-cell may locate unused joint data states at any location: (0, 0), (0, 5), (5, 0), and (5, 5) within the joint data state map 300 (in any order, or in any combination) in order to reduce bit error rates due to data retention issues and/or read/program disturbs, while at the same time maintaining a suitable dual-cell gray-code encoding scheme within the joint data state map 400 to further reduce bit error rates. As noted previously, the joint data states at the locations (0, 0), (0, 5), (5, 0), and (5, 5) may comprise error-prone joint data states.

The use of a dual-cell gray-code encoding scheme provides advantages. As illustrated in FIG. 3, a single read may determine whether the highest order bit (i.e., the bit furthest to the left) is a high or a low value (e.g., a "1" or a "0"). For example, with respect to the embodiment illustrated in FIG. 3, a read voltage corresponding to a read position between threshold voltage ranges for the second and third data states in the second memory cell (i.e., between column 2 and column 3, as labeled in FIG. 3) may be used to ascertain the value of the highest order bit. Note, that this is because the highest order bit is the same for cells in all rows and columns left of column 2 (e.g. "1") and right of column 3 (e.g. "0"). Thus, the controller does not need to sense the data state of the first memory cell in order to ascertain the value of the highest order bit because the highest order bit remains the same irrespective of the data state of the first memory cell.

FIG. 4 illustrates an example of a joint data state map 400 that utilizes 3.5 fractional bits-per-cell, according to another embodiment of the present disclosure. The joint data state map 400 shown in FIG. 4 is based on a pair of memory cells (not shown) that are each programmed to store one of twelve different data states within each memory cell. As illustrated in FIG. 4, each of the rows 410 represent a different data state for a first memory cell, while each of the columns 420 represent a different data state for a second memory cell.

Each set of twelve different data states corresponding to each memory cell can jointly represent a total of 144 different joint data states, as illustrated in the 12×12 joint data state map 400 shown in FIG. 4. Each joint data state, as illustrated, is associated with one of the twelve rows 410 (labeled as rows 0-11) and one of the twelve columns 420 (labeled as columns 0-11) in the joint data state map 400. For example, the joint data state at (0, 0) is associated with the binary number 1111111. Likewise, the joint data state at (9, 11) is associated with the binary number 0001101, and so forth.

The pair of memory cells that form the basis of the joint data state map 400 shown in FIG. 4 are each configured to represent 3.5 fractional bits-per-cell with 12 data states in each memory cell. Thus, as illustrated in FIG. 4, there are 144 total possible joint data states. Thus, the available number of data states for a memory cell is a non-power-of-two number, and the total number of joint data states is also a non-power-of-two number. As previously described, a subset of the total number of joint data states can be selected as a power-of-two number of joint data states to represent or encode user data. In this example, a subset of the joint data states (comprising $2^7$ or 128 out of the 144 joint data states) is selected to represent user data (i.e., 128 used joint data states). In FIG. 4, a 7-bit binary number is associated with each used joint data state. Thus, each used joint data state is associated with one of a possible of 128 different values.

In this example, the remaining 16 joint data states (144−128=16) are unused joint data states that are not used to represent user data and are shown as "blacked-out" in the joint data state map 400. In this example, the number of unused joint data states (in this case, 16) is a power-of-two number.

As illustrated in FIG. 4, the 128 used joint data states are each associated with a defined data value used to represent user data, such as a unique 7-bit binary number. As noted above, a 7-bit binary number can represent a total of $2^7$ (or 128) different values. Each of these different binary numbers can be arranged within the joint data state map 400 such that the binary numbers of any two used joint data states that are horizontally or vertically adjacent to each other within the joint data state map 400 differ from each other by only one bit, according to one embodiment of a dual-cell gray-code encoding scheme disclosed herein. This gray-coding arrangement reduces the magnitude of errors caused by unintentional shifts of data states to adjacent data states within the memory cells by limiting the number of bits that change between adjacent data states to only one bit.

As previously discussed, one method of reducing bit error rates caused by unintentional shifts of data states between adjacent data states within a memory cell is to select certain locations within a joint data state map for placement of the unused data states, e.g., to define error-prone joint data states as unused joint data states. Memory cells that store a highest data state may experience data retention issues, resulting in an unintentional downward shift of the data state, and memory cells that store a lowest data state may experience read/program disturb issues, resulting in an unintentional upward shift of the data state.

Accordingly, it can be beneficial to place the unused data states in one or more of the corners of the joint data state map 400 to avoid combinations of the highest data states and/or the lowest data states for the memory cells, while maintaining the dual-cell gray-code encoding scheme of the joint data state map 400.

In the example shown in FIG. 4, one of the unused joint data states has been placed at (11, 11) corresponding to a first memory cell (of the pair of memory cells) in a highest data state and a second memory cell (of the pair of memory cells) in the highest data state. In this manner, bit error rates due to data retention issues for both cells are minimized. Likewise, another one of the unused joint data states shown in FIG. 4 has been placed at (11, 0) corresponding to the first memory cell in a highest data state and the second memory cell in a lowest data state. In this manner, bit error rates due to data retention issues for the first memory cell are minimized, and bit error rates due to read/program disturbs for the second memory cell are also minimized. Moreover, the dual-cell gray-code encoding scheme of the joint data state map 400 has been maintained with unused joint data states placed at (11, 11) and (11, 0), which comprise error-prone joint data states.

In other embodiments of joint data state maps that utilize 3.5 fractional bits-per-cell (not shown), the additional placement of unused joint data states can also be realized at (0, 0) and/or (0, 11), while maintaining a dual-cell gray-code encoding scheme of joint data states within the joint data state map 400. For example, placement of a unused joint data state at (0, 0) would correspond to the first memory cell in a lowest data state and the second memory cell in a lowest data state. In this manner, bit error rates due to read/program disturbs for both memory cells would be minimized. Likewise, placement of a unused joint data state at (0, 11) would correspond to the first memory cell in a lowest data state and the second memory cell in a highest data state. In this manner, bit error rates due to data retention issues for the second memory cell would be minimized and bit error rates due to read/program disturbs for the first memory cell would also be minimized.

In summary, embodiments of different joint data state map implementations utilizing 3.5 fractional bits-per-cell may locate unused joint data states at any location: (0, 0), (0, 11), (11, 0), and (11, 11) within the joint data state map 400 (in any order, or in any combination) in order to reduce bit error rates due to data retention issues and/or read/program disturbs, while at the same time maintaining a suitable dual-cell gray-code encoding scheme within the joint data state map 400 to further reduce bit error rates. As indicated previously, in the embodiment illustrated in FIG. 4, the joint data states at the locations (0, 0), (0, 11), (11, 0), and (11, 11) (i.e., joint data states at the corners of the joint data state map 400) comprise error-prone joint data states. It should also be noted that error-prone joint data states could be situated at different locations in alternative embodiments.

As indicated previously, the use of a dual-cell gray-code encoding scheme provides advantages. As illustrated in FIG. 4, a single read may determine whether the highest order bit (i.e., the bit furthest to the left) is a high or a low value (e.g., a "1" or a "0"). For example, with respect to the embodiment illustrated in FIG. 4, a read voltage corresponding to a read position between threshold voltage ranges for the fifth and sixth data states in the second memory cell (i.e., between column 5 and column 6, as labeled in FIG. 4) may be used to ascertain the value of the highest order bit. Thus, the controller does not need to sense the data state of the first memory cell in order to ascertain the value of the highest order bit because the highest order bit remains the same irrespective of the data state of the first memory cell.

FIG. 5 illustrates an example of a joint data state map 500 that utilizes 3.5 fractional bits-per-cell, according to another embodiment of the present disclosure. The joint data state map 500 shown in FIG. 5 is similarly based on a pair of memory cells (not shown) that are each programmed to store one of twelve different data states within each memory cell. As illustrated in FIG. 5, each of the rows 510 represent a different data state for a first memory cell, while each of the columns 520 represent a different data state for a second memory cell.

Each set of twelve different data states corresponding to each memory cell can jointly represent a total of 144 different joint data states, as illustrated in the 12×12 joint data state map 500 shown in FIG. 5. Each joint data state, as illustrated, is associated with one of the twelve rows 510 (labeled as rows 0-11) and one of the twelve columns 520 (labeled as columns 0-11) in the joint data state map 500. For example, the joint data state at (0, 1) is associated with the binary number 1110101, the joint data state at (10, 11) is associated with the binary number 0010011, and so forth.

The pair of memory cells that form the basis of the joint data state map 500 shown in FIG. 5 are each configured to represent 3.5 fractional bits-per-cell with 12 data states in each memory cell, 144 total possible joint data states, and 7-bit binary numbers associated with the joint data states. Thus, the available number of data states for a memory cell is a non-power-of-two number and the total number of joint data states is also a non-power-of-two number. As previously described, a subset of the total number of joint data states can be selected as a power-of-two number of joint data states to represent or encode user data. In this example, a subset of the joint data states (comprising $2^7$ or 128 out of the 144 joint data states) is selected to represent user data (i.e., 128 used joint data states).

In this example, the remaining 16 joint data states (144−128=16) are unused joint data states that are not used to represent user data and are shown as "blacked-out" in the joint data state map 500. In this example, the number of unused joint data states (in this case, 16) is a power-of-two number.

As illustrated in FIG. 5, 128 used joint data states are each associated with a defined data value used to represent user data, such as a unique 7-bit binary number. A 7-bit binary number can represent a total of $2^7$ (or 128) different values. As illustrated in FIG. 5, each of these different binary numbers are further arranged within the joint data state map 500 such that the binary numbers of any two used joint data states that are horizontally or vertically adjacent to each other within the joint data state map 500 differ from each other by only one bit, according to one embodiment of a dual-cell gray-code encoding scheme disclosed herein. This gray-coding arrangement helps reduce the magnitude of errors caused by unintentional shifts of data states to adjacent data states within the memory cells by limiting the number of bits that change between adjacent data states to only one bit.

As previously discussed, one method of reducing bit error rates caused by unintentional shifts of data states between adjacent data states within a memory cell is to select certain locations within a joint data state map for placement of the unused data states. Memory cells that store a highest data state tend to suffer from data retention issues, resulting in an unintentional downward shift of the data state, and memory cells that store a lowest data state tend to suffer from read/program disturb issues, resulting in an unintentional upward shift of the data state.

Accordingly, it would be beneficial to place the unused data states in one or more of the corners of the joint data state map 500 to avoid combinations of the highest data states and/or the lowest data states for the memory cells, while maintaining the dual-cell gray-code encoding scheme of the joint data state map 500.

In the example shown in FIG. 5, each of the four corners of the joint data state map 500 have been selected as unused joint data states. For example, one of the unused joint data states has been placed at (11, 11) corresponding to a first memory cell in a highest data state and a second memory cell in the highest data state. In this manner, bit error rates due to data retention issues for both cells are minimized. Another one of the unused joint data states shown in FIG. 5 has been placed at (11, 0) corresponding to the first memory cell in the highest data state and the second memory cell in a lowest data state. In this manner, bit error rates due to data retention issues for the first memory cell are minimized, and bit error rates due to read/program disturbs for the second memory cell are also minimized. Another one of the unused joint data states shown in FIG. 5 has been placed at (0, 11) corresponding to the first memory cell in the lowest data state and the second memory cell in the highest data state. In this manner, bit error rates due to data retention issues for the second memory cell are minimized, and bit error rates due to read/program disturbs for the first memory cell are also minimized. Another one of the unused joint data states has been placed at (0, 0) corresponding to the first memory cell in the lowest data state and a second memory cell in the lowest data state. In this manner, bit error rates due to read/program disturbs for both cells are minimized. Moreover, the dual-cell gray-code encoding scheme of the joint data state map 500 has been maintained with unused joint data states placed at (0, 0), (0, 11), (11, 0) and (11, 11). As indicated previously, the joint data states at the locations (0, 0), (0, 11), (11, 0), and (11, 11) (i.e., joint data states at the corners of the joint data state map 400) comprise error-prone joint data states. It should also be noted that error-prone joint data states may be positioned at other locations in alternative embodiments.

In summary, embodiments of different joint data state map implementations utilizing 3.5 fractional bits-per-cell may locate unused joint data states at any location (such as at (0, 0), (0, 11), (11, 0), and (11, 11)) within the joint data state map (in any order, or in any combination) to reduce bit error rates due to data retention issues and/or read/program disturbs, while at the same time maintaining a suitable dual-cell gray-code encoding scheme within the joint data state map to further reduce bit error rates. Moreover, embodiments of joint data state map implementations utilizing 4.5 fractional bits-per-cell, 5.5 fractional bits-per-cell, 6.5 fractional bits-per-cell, and so forth (not shown), may also locate unused joint data states at any corner location with the joint data state map (in any order, or in any combination) in order to reduce bit error rates due to data retention issues and/or read/program disturbs, while at the same time maintaining a suitable dual-cell gray-code encoding scheme within the joint data state map to further reduce bit error rates.

As explained previously, the use of a dual-cell gray-code encoding scheme provides advantages. As illustrated in FIG. 5, a single read may determine whether the highest order bit (i.e., the bit furthest to the left) is a high or a low value (e.g., a "1" or a "0"). For example, with respect to the embodiment illustrated in FIG. 5, a read voltage corresponding to a read position between threshold voltage ranges for the fifth and sixth data states in the second memory (i.e., between column 5 and column 6, as labeled in FIG. 5) cell may be employed to ascertain the value of the highest order bit. Thus, the controller does not need to sense the data state of the first memory cell in order to ascertain the value of the highest order bit because the highest order bit remains the same irrespective of the data state of the first memory cell.

Figure 6:
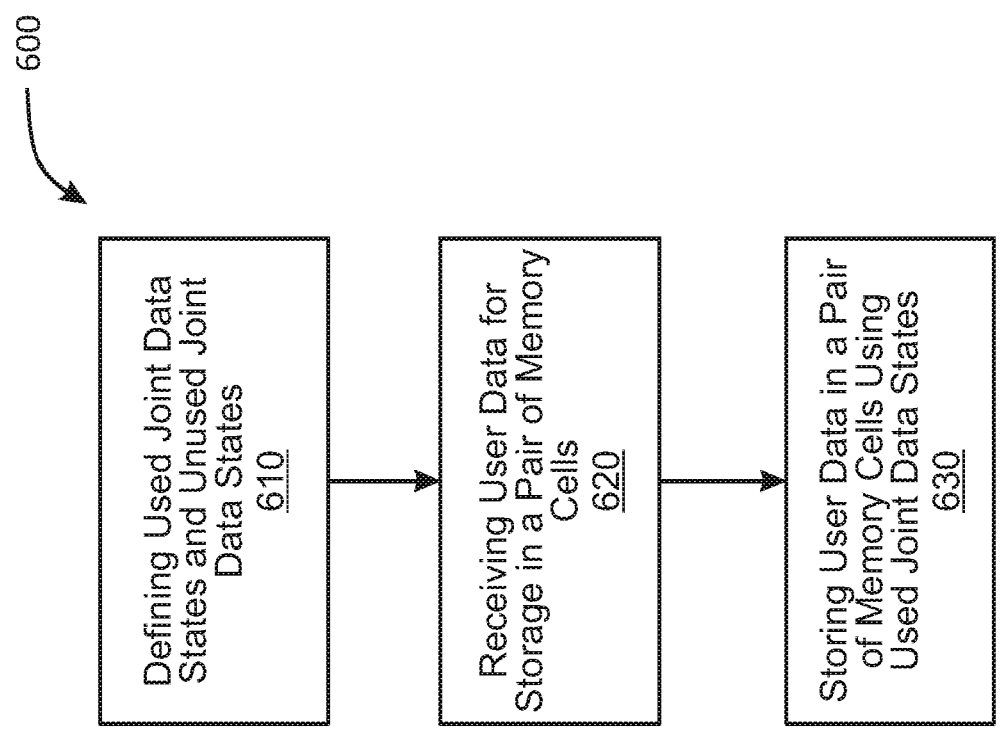
FIG. 6 is a flow diagram illustrating an embodiment of storing user data on a pair of memory cells.

FIG. 6 is a flow diagram illustrating a method 600 of storing user data on a pair of memory cells. Used joint data states and unused joint data states within the joint data states are defined 610. Used joint data states are a subset of the joint data states associated with defined data values used to represent or encode user data. Unused joint data states are a subset of the joint data states associated with undefined (or unused) data values which are not used to represent or encode user data. It should be noted that, in certain embodiments, this defining 610 may be done before, after, or concurrent with step 620 and step 630. For example, defining 610 may be made at the time the pertinent memory cells are manufactured or at the time of programming. In various embodiments of different joint data state maps, the placement of the unused joint data states for each different joint data state map embodiment can vary and may be defined 610 to be located in one or more of the corners of the joint data state map, in any number, order, or combination of corners for each of the different joint data state map embodiments. The foregoing may be achieved while at the same time maintaining a suitable dual-cell gray-code encoding scheme within each different joint data state map embodiment, as previously discussed with reference to FIGS. 3-5.

User data (such as data formulated by a user, system data, host data, etc.) is received 620 for storage at a memory apparatus that comprises a pair of memory cells configured to represent data using joint data states. As previously noted, the pair of memory cells may comprise any type of memory cell, such as non-volatile NAND flash memory cells that utilize floating-gate, or charge trap, transistors. Each joint data state comprises a pair of data states (where each data state is a physical state of each memory cell, such as a threshold voltage level) stored in the pair of memory cells where at least some joint data states can correspond to a particular binary number. Each joint data state can be represented in a joint data state map, as previously described herein.

After receiving 620 the user data, the user data is stored 630 in a pair of memory cells using exclusively used joint data states according to a dual-cell gray-code encoding scheme, also discussed previously with reference to FIGS. 3-5.

Figure 7:
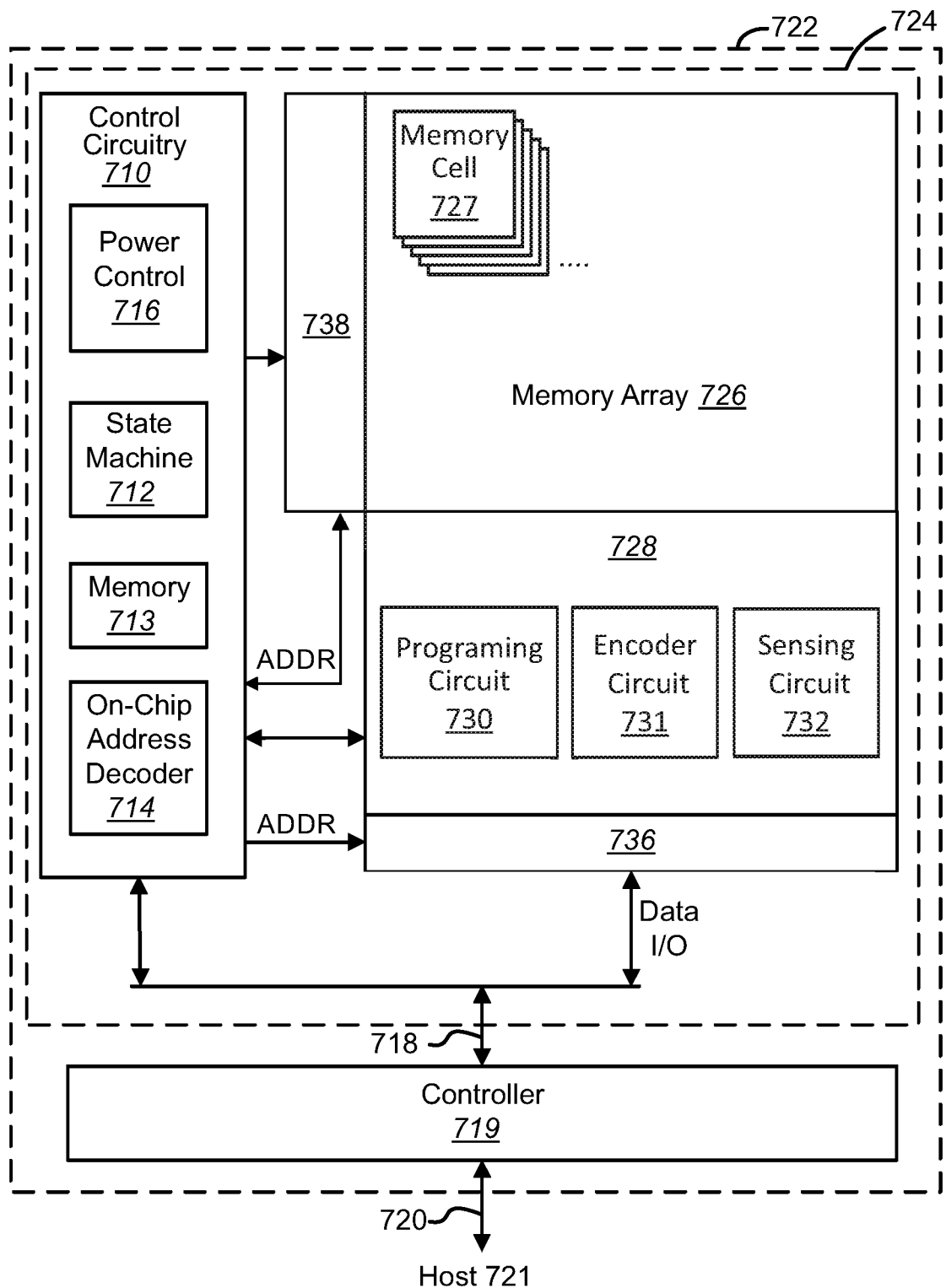
FIG. 7 is a block diagram illustrating an embodiment of a non-volatile memory storage system and apparatus.

FIG. 7 is a block diagram of a non-volatile memory system using single row/column decoders and read/write circuits. The diagram illustrates a memory device 722 having read/write circuits for reading and programming a page of memory cells 727, according to one embodiment. The memory device 722 can include one or more memory die 724. A "memory die" comprises a block of semiconducting material on which a memory circuit is fabricated and, as used herein, also includes the memory circuit disposed thereon. The memory die 724 includes a two-dimensional or three-dimensional memory array 726 of memory cells 727, control circuitry 710, and read/write circuits 728.

In some embodiments, the array 726 of memory cells 727 can be three dimensional, as illustrated in FIG. 2. The memory array 726 is addressable by word lines via a row decoder 738 and by bit lines via a column decoder 736. The read/write circuits 728 allow a page of memory cells 727 to be read or programmed in parallel and can include a programming circuit 730, an encoder circuit 731, and a sensing circuit 732 (e.g., multiple sense blocks 236).

As used herein, a "programming circuit" refers to a circuit utilized to execute or deliver one or more program loops. A "program loop" comprises a period of time encompassing a programming pulse and extends until another programming pulse is issued, or the particular programming procedure comes to an end. A program loop encompasses a programming pulse followed by one or more verification pulses. A "verification" comprises a procedure to determine whether a particular characteristic has been satisfied in a memory cell, such as determining that a particular threshold voltage level has been stored in a memory cell.

As used herein, an "encoder circuit" or "encoder" refers to a circuit that is utilized to encode user data into joint data states that are arranged according to a dual-cell gray-code encoding scheme, in which at least one of the joint data states does not encode user data.

As used herein, a "sensing circuit" is a circuit utilized to sense a value stored in a memory cell, such as a threshold voltage level. A sensing circuit can comprise one or more sensing blocks coupled to a particular word or set of word lines. Often, a series of electrical pulses applied to a control gate are utilized to verify a threshold voltage level.

In an embodiment, the programming circuit 730 is configured to deliver (or supply) program loops to the memory array 726. Each program loop encompasses a single program pulse and extends until a subsequent program pulse is sent. For example, the programming circuit 730 sends a series of program pulses to a selected word line coupled to memory cells 727 of the memory array 726. The program pulses can increase in amplitude (e.g., increase in voltage in a linear or non-linear manner) over a number of programming cycles to progressively (or incrementally) increase the threshold voltages of the memory cells 727 (e.g., a threshold voltage in a flash configuration or a resistive state in a resistive memory configuration) to states corresponding to data being stored. The term "progressively" or "incrementally" means occurring in steps over time (e.g., over a number of program loops).

In an embodiment, the encoder circuit 731 is configured to convert user data into joint data states according to a dual-cell gray-code encoding scheme in which one or more error-prone joint data states do not encode user data.

In another embodiment, the encoder circuit 731 is configured to encode user data on a first memory cell and a second memory cell using joint data states according to a dual-cell gray-code encoding scheme. In this embodiment, the joint data states comprise a first error-prone joint data state and a second error-prone joint data state that each do not encode user data (i.e., comprise error-prone joint data states that are also unused joint data states). The first error-prone joint data state comprises a highest data state for the first memory cell and the highest data state for the second memory cell. The second error-prone joint data state comprises a lowest data state for the first memory cell and the lowest data state for the second memory cell.

As noted above with respect to FIGS. 3-5, any embodiment of the encoder circuit 731 can utilize joint data states corresponding to a particular binary number used to represent or encode user data, and each joint data state can be represented in a joint data state map. Subsets of used joint data states and unused joint data states can be selected and arranged within the joint data state map. The used joint data states are associated with defined data values. The unused joint data states are not associated with data values. In various embodiments of different joint data state maps, the placement of the unused joint data states for each different joint data state map embodiment can vary, and may be located in one or more of the corners of the joint data state map in any number, order, or combination of corners for each of the different joint data state map embodiments, while at the same time maintaining a suitable gray-coding scheme within each different joint data state map embodiment.

In an embodiment, the read/write circuits 728 include a pass circuit (not shown) in FIG. 7. The pass circuit is configured to deliver one or more pass pulses to unselected word lines of the memory array 726. In an embodiment, the pass circuit is configured to increase a voltage of unselected word lines after the initiation of and during one or more program pulses.

Typically, a controller 719 is included in the same memory device 722 (e.g., a removable storage card) for the one or more memory die 724. Commands and data are transferred between the host and controller 719 via bus 720 and between the controller 719 and the one or more memory die 724 via lines 718.

The control circuitry 710 cooperates with the read/write circuits 728 to perform memory operations on the memory array 726, and includes a state machine 712, an on-chip address decoder 714, and a power control module 716. The state machine 712 provides chip-level control of memory operations. The on-chip address decoder 714 provides an address interface between that used by the host 721 or a memory controller to the hardware address used by the decoders 736 and 738. The power control module 716 controls the power and voltages supplied to the word lines and bit lines during memory operations. A memory 713 can store original write data, modified write data, and status bits for use by the state machine 712.

In some implementations, some of the components of FIG. 7 can be combined. In various designs, one or more of the components (alone or in combination), other than memory array 726, can be thought of as a managing or control circuit. For example, one or more control circuits can include any one of, or a combination of, control circuitry 710, state machine 712, decoders 714, 736, 738, power control module 716, read/write circuits 728, programming circuit 730, encoder circuit 731, sensing circuit 732, and/or controller 719, and so forth.

In another embodiment, a non-volatile memory system uses dual row/column decoders and read/write circuits. The various peripheral circuits access opposite sides of the memory array 726 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 726. In this way, the density of the read/write modules is essentially reduced by one half.

An embodiment of an apparatus disclosed herein includes a pair of memory cells configured to represent data using joint data states where one of the joint data states comprises an error-prone joint data state. The apparatus further includes an encoder configured to convert user data into joint data states according to a dual-cell gray-code encoding scheme in which the error-prone joint data state does not encode user data.

In an embodiment of the apparatus, the error-prone joint data state comprises a highest data state for a first memory cell and a highest data state for a second memory cell. In an embodiment of the apparatus, the joint data states further comprise a second error-prone joint data state that does not encode user data, and the second error-prone joint data state comprises a lowest data state for the first memory cell and a lowest data state for the second memory cell. In an embodiment of the apparatus, the joint data states further comprise a third error-prone joint data state and a fourth error-prone joint data state that each do not encode user data. The third error-prone joint data state comprises the lowest data state for the first memory cell and the highest data state for the second memory cell. The fourth error-prone joint data state comprises the highest data state for the first memory cell and the lowest data state for the second memory cell.

In an embodiment of the apparatus, a dual-cell gray-code encoding scheme is employed. In an embodiment of the apparatus, the pair of memory cells comprises a first multi-level cell and a second multi-level cell. In an embodiment of the apparatus, the first memory cell and the second memory cell are each selected from a group consisting of a 2.5 bit fractional memory cell, a 3.5 bit fractional memory cell, and a 4.5 bit fractional memory cell.

An embodiment of a memory apparatus disclosed herein is configured to receive user data for storage in a pair of memory cells configured to represent data using joint data states, determine used joint data states and unused joint data states within the joint data states, and store the user data on the pair of memory cells using exclusively used joint data states according to a dual-cell gray-code encoding scheme. A first unused joint data state comprises a first memory cell in a highest data state and a second memory cell in a highest data state.

In an embodiment of the memory apparatus, the joint data states further comprise a second unused joint data state comprising the first memory cell in a lowest data state and the second memory cell in a lowest data state. In an embodiment of the memory apparatus, the joint data states further comprise a third unused joint data state comprising the first memory cell in the highest data state and the second memory cell in the lowest data state. In an embodiment of the memory apparatus, the joint data states further comprise a fourth unused joint data state comprising the first memory cell in the lowest data state and the second memory cell in the highest data state.

In an embodiment of the memory apparatus, a dual-cell gray-code encoding scheme is employed. In an embodiment of the memory apparatus, the first memory cell comprises a first multi-level cell and the second memory cell comprises a second multi-level cell. In an embodiment of the memory apparatus, the first memory cell and the second memory cell are each selected from a group consisting of a 2.5 fractional bit memory cell, a 3.5 fractional bit memory cell, and a 4.5 bit fractional memory cell.

An embodiment of a non-volatile memory storage system comprises a first memory cell, a second memory cell, and an encoder configured to encode user data on the first memory cell and the second memory cell using joint data states according to a dual-cell gray-code encoding scheme. The joint data states comprise a first error-prone joint data state and a second error-prone joint data state that each do not encode user data. The first error-prone joint data state comprises a highest data state for the first memory cell and the highest data state for the second memory cell. The second error-prone joint data state comprises a lowest data state for the first memory cell and the lowest data state for the second memory cell.

In an embodiment of the non-volatile memory storage system, the joint data states further comprise a third error-prone joint data state that does not encode user data. The third error-prone joint data state comprises the lowest data state for the first memory cell and the highest data state for the second memory cell. In an embodiment of the non-volatile memory storage system, the joint data states further comprise a fourth error-prone joint data state that does not encode user data. The fourth error-prone joint data state comprises the highest data state for the first memory cell and the lowest data state for the second memory cell.

In an embodiment of the non-volatile memory storage system, the first memory cell comprises a first multi-level cell and the second memory cell comprises a second multi-level cell. In an embodiment of the non-volatile memory storage system, the first memory cell and the second memory cell are each selected from a group consisting of a 2.5 bit fractional memory cell, a 3.5 bit fractional memory cell, and a 4.5 bit fractional memory cell. In an embodiment of the non-volatile memory storage system, a number of the joint data states is not a power of two.

One of skill in the art will recognize that this disclosure is not limited to the two-dimensional and three-dimensional exemplary structures described but covers all relevant memory structures within the spirit and scope of the disclosure as described herein and as understood by one of skill in the art. The illustrations of the embodiments described herein are intended to provide a general understanding of the embodiments. Other embodiments can be utilized and derived from the disclosure, such that structural and logical substitutions and changes can be made without departing from the scope of the disclosure. This disclosure is intended to cover any and all subsequent adaptations or variations of embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Aspects of the present disclosure can be embodied as an apparatus, system, method, or computer program product. Accordingly, aspects of the present disclosure can take the form of an entirely hardware embodiment, an entirely software embodiment (including firmware, resident software, micro-code, or the like) or an embodiment combining software and hardware aspects that can all generally be referred to herein as a "circuit," "module," "apparatus," or "system." Furthermore, aspects of the present disclosure can take the form of a computer program product embodied in one or more non-transitory computer readable storage media storing computer readable and/or executable program code.

A module can be implemented as a hardware circuit comprising custom VLSI circuits or gate arrays, off-the-shelf semiconductors such as logic chips, transistors, or other discrete components. A module can also be implemented in programmable hardware devices such as field programmable gate arrays, programmable array logic, programmable logic devices, or the like. Modules can also be implemented at least partially in software for execution by various types of processors. An identified module of executable code can, for instance, comprise one or more physical or logical blocks of computer instructions which can, for instance, be organized as an object, procedure, or function. Nevertheless, the executables of an identified module need not be physically located together, but can comprise disparate instructions stored in different locations which, when joined logically together, comprise the module and achieve the stated purpose for the module. Indeed, a module of executable code can include a single instruction, or many instructions, and can even be distributed over several different code segments, among different programs, across several memory devices, or the like. Where a module or portions of a module are implemented in software, the software portions can be stored on one or more computer readable and/or executable storage media. Any combination of one or more computer readable storage media can be utilized. A computer readable storage medium can include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium can be any tangible and/or non-transitory medium that can contain or store a program for use by or in connection with an instruction execution system, apparatus, processor, or device.

Computer program code for carrying out operations for aspects of the present disclosure can be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like.

A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In one embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

Aspects of the present disclosure are described herein with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

What is claimed is:

1. An apparatus comprising:
    an encoder configured to convert user data into selected joint data states for storage in a pair of memory cells according to a dual-cell gray-code encoding scheme in which available joint data states include a plurality of error-prone joint data states in which memory cells are more susceptible to errors than other joint data states, the selected joint data states do not include error-prone joint data states and the plurality of error-prone joint data states are not used for storage of the user data.

2. The apparatus of claim 1, wherein the error-prone joint data state comprises a highest data state for a first memory cell and a highest data state for a second memory cell.

3. The apparatus of claim 2, wherein the joint data states further comprise a second error-prone joint data state that does not encode user data,
    the second error-prone joint data state comprising a lowest data state for the first memory cell and a lowest data state for the second memory cell.

4. The apparatus of claim 3, wherein the joint data states further comprise a third error-prone joint data state and a fourth error-prone joint data state that each do not encode user data,
    the third error-prone joint data state comprising the lowest data state for the first memory cell and the highest data state for the second memory cell, and
    the fourth error-prone joint data state comprising the highest data state for the first memory cell and the lowest data state for the second memory cell.

5. The apparatus of claim 1, wherein the dual-cell gray-code encoding scheme comprises a scheme in which each row of a joint data state map represents a different data state for a first memory cell of the pair of memory cells, each column in the joint data state map represents a different data state for a second memory cell of the pair of memory cells, and in which vertically and horizontally adjacent cells in the joint data state map differ only by one bit.

6. The apparatus of claim 1, wherein the pair of memory cells comprises a first multi-level cell and a second multi-level cell.

7. The apparatus of claim 2, wherein the first memory cell and the second memory cell are each selected from a group consisting of a 2.5 bit fractional memory cell, a 3.5 bit fractional memory cell, and a 4.5 bit fractional memory cell.

8. A memory apparatus configured to:
receive user data for storage in a pair of memory cells configured to represent data using joint data states;
determine used joint data states and unused joint data states within the joint data states, wherein memory cells are more error-prone in the unused joint data states than in the used joint data states; and
store the user data on the pair of memory cells using exclusively the used joint data states, not the unused joint data states, according to a dual-cell gray-code encoding scheme in which each row of a joint data state map represents a different data state for a first memory cell of the pair of memory cells, each column of the joint data state map represents a different data state for a second memory cell of the pair of memory cells, and in which vertically and horizontally adjacent cells in the joint data state map differ only by one bit.

9. The memory apparatus of claim 8, wherein the joint data states comprise a first unused joint data state comprising a first memory cell in a highest data state and a second memory cell in a highest data state and a second unused joint data state comprising the first memory cell in a lowest data state and the second memory cell in a lowest data state.

10. The memory apparatus of claim 9, wherein the joint data states further comprise a third unused joint data state comprising the first memory cell in the highest data state and the second memory cell in the lowest data state.

11. The memory apparatus of claim 10, wherein the joint data states further comprise a fourth unused joint data state comprising the first memory cell in the lowest data state and the second memory cell in the highest data state.

12. The memory apparatus of claim 11, wherein the joint data states further comprise at least a fifth, a sixth, a seventh, and an eighth unused joint data state.

13. The memory apparatus of claim 8, wherein the joint data states comprise a first unused joint data state comprising a first memory cell in a highest data state and a second memory cell in a highest data state and a second unused joint data state comprising the first memory cell in a lowest data state and the second memory cell in a lowest data state, the first unused joint data state suffers from data retention issues and the second unused joint data state suffers from read/program disturb issues.

14. The memory apparatus of claim 9, wherein the first memory cell and the second memory cell are each selected from a group consisting of a 2.5 bit fractional cell, a 3.5 bit fractional cell, and a 4.5 bit fractional cell.

15. A non-volatile memory storage system comprising:
a first memory cell;
a second memory cell; and
an encoder configured to encode user data on the first memory cell and the second memory cell using joint data states according to a dual-cell gray-code encoding scheme, the joint data states comprising a first error-prone joint data state, a second error-prone joint data state, a third error-prone data state and a fourth error-prone data state that are each more susceptible to errors than cells in other joint data states and that each do not encode user data,
the first error-prone joint data state comprising a highest data state for the first memory cell and the highest data state for the second memory cell,
the second error-prone joint data state comprising a lowest data state for the first memory cell and the lowest data state for the second memory cell,
the third error-prone joint data state comprising the lowest data state for the first memory cell and the highest data state for the second memory cell, and
the fourth error-prone joint data state comprising the highest data state for the first memory cell and the lowest data state for the second memory cell.

16. The non-volatile memory storage system of claim 15, wherein the dual-cell gray-code encoding scheme encodes data such that a joint data state map in which each row represents a different data state of the first memory cell and each column represents a different data state of the second memory cell, all data states in a first plurality of columns have a first bit at a first value, and all data states in a second plurality of columns have the first bit at a second value that is the inverse of the first value.

17. The non-volatile memory storage system of claim 16 further comprising a sensing circuit configured to sense the first bit by sensing the second memory cell and not the first memory cell.

18. The non-volatile memory storage system of claim 15, wherein according to the dual-cell gray-code encoding scheme each row of a joint data state map represents a different data state for the first memory cell, each column of the joint data state map represents a different data state for the second memory cell, vertically adjacent cells in the joint data state map differ only by one bit and horizontally adjacent cells in the joint data state map differ only by one bit.

19. The non-volatile memory storage system of claim 15, wherein the first memory cell and the second memory cell are each selected from a group consisting of a 2.5 bit fractional cell, a 3.5 bit fractional cell, and a 4.5 bit fractional cell.

20. The non-volatile memory storage system of claim 18, wherein a number of the joint data states is not a power of two.

* * * * *